(12) United States Patent
Iijima et al.

(10) Patent No.: US 6,874,638 B2
(45) Date of Patent: Apr. 5, 2005

(54) WAFER CASSETTE

(75) Inventors: Toshihiko Iijima, Nirasaki (JP); Shuji Akiyama, Nirasaki (JP); Tadahiro Obayashi, Kikuchi-gun (JP)

(73) Assignees: Tokyo Electron Limited, Tokyo (JP); Miraial Co., Ltd., Tokyo (JP)

( * ) Notice: Subject to any disclaimer, the term of this patent is extended or adjusted under 35 U.S.C. 154(b) by 149 days.

(21) Appl. No.: 10/320,685

(22) Filed: Dec. 17, 2002

(65) Prior Publication Data

US 2003/0122146 A1 Jul. 3, 2003

(30) Foreign Application Priority Data

Dec. 27, 2001 (JP) ............................... 2001-398606

(51) Int. Cl.[7] ............................................... B65D 85/90
(52) U.S. Cl. ..................... 206/711; 206/454; 211/41.18
(58) Field of Search ................... 206/710–711, 724, 206/454–455; 211/41.18; 118/500

(56) References Cited

U.S. PATENT DOCUMENTS

| | | | | |
|---|---|---|---|---|
| 3,467,242 A | * | 9/1969 | De Rousse | ................ 206/711 |
| 4,718,549 A | * | 1/1988 | Rissotti et al. | .............. 206/711 |
| 6,039,186 A | * | 3/2000 | Bhatt et al. | ................. 206/711 |

FOREIGN PATENT DOCUMENTS

JP          7-326657         12/1995

* cited by examiner

Primary Examiner—Bryon P. Gehman
(74) Attorney, Agent, or Firm—Oblon, Spivak, McClelland, Maier & Neustadt, P.C.

(57) ABSTRACT

A wafer cassette comprises a case body and an adapter that supports substrates. There are adapters of various types corresponding to the size of the substrates to be supported. The case body and the adapter of any type are united in a manner such that fitting portions of the case body are fitted individually in fitting holes of the adapter.

8 Claims, 8 Drawing Sheets

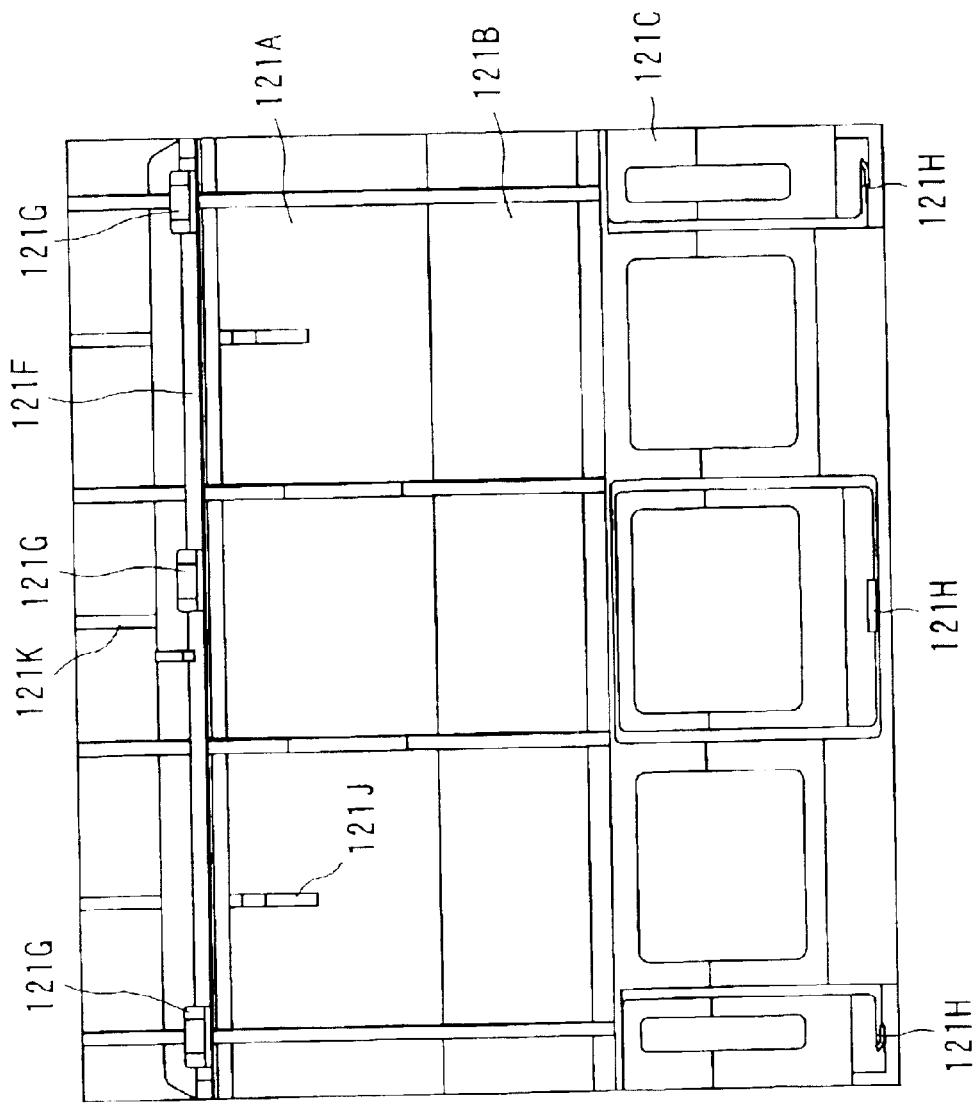
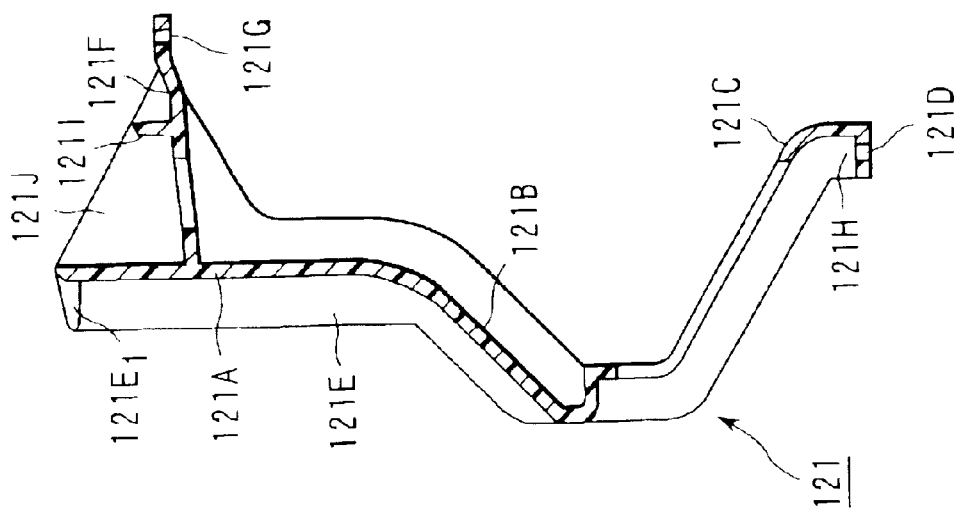
FIG. 3B
FIG. 3A

WAFER CASSETTE

CROSS-REFERENCE TO RELATED APPLICATIONS

This application is based upon and claims the benefit of priority from the prior Japanese Patent Application No. 2001-398606, filed Dec. 27, 2001, the entire contents of which are incorporated herein by reference.

BACKGROUND OF THE INVENTION

1. Field of the Invention

The present invention relates to a wafer cassette, and more specifically, to a wafer cassette capable of storing semiconductor wafers (hereinafter referred to as "wafers") having different diameters.

2. Description of the Related Art

Wafer cassettes for transporting wafers are used between processes for semiconductor manufacture. A cassette that is stored with a given number of wafers is used in each manufacturing process. Each of the wafers that are taken out one after another from the wafer cassette is processed as specified. Probers are widely used in a wafer inspection process. A plurality of probers are arranged at given spaces. These probers are used to check the electrical properties of devices that are formed on a wafer.

Normally, a prober comprises a loader chamber and a prober chamber, and examines the electric properties of devices. The loader chamber is provided with a cassette stage portion, a wafer conveyor mechanism, and a pre-alignment mechanism (hereinafter referred to as "sub-chuck"). A wafer cassette that is stored with a plurality of (e.g., 25) wafers placed on the cassette stage portion. The wafer conveyor mechanism transports the wafers one after another from the cassette stage portion. The sub-chuck pre-aligns the wafers that are transported by means of the wafer conveyor mechanism. The prober chamber is provided with a step (hereinafter referred to as "main chuck"), an alignment mechanism, a probe card, and a test head. The main chuck carries each wafer thereon and moves in the X-, Y-, Z-, and θ-directions. The alignment mechanism aligns each wafer in cooperation with the main chuck. The probe card is located over the main chuck. The test head is interposed between the probe card and a tester.

In inspecting the devices, an operator first places the wafer cassette, stored with the wafers, on the cassette stage portion of the loader chamber. Then, the wafer conveyor mechanism takes out the wafers one after another from the wafer cassette, and pre-aligns each wafer on the sub-chuck. The wafer conveyor mechanism moves the wafer onto the main chuck in the prober chamber. In the prober chamber, the main chuck and the alignment mechanism align the wafer. The main chuck indexes the aligned wafer. For each indexing cycle, the prober brings probes of the probe card individually into electrical contact with electrodes of devices formed on the wafer. In this contact state, the devices are checked for electrical properties. After the inspection of the devices on the wafer is finished, the wafer conveyor mechanism in the loader chamber receives the wafer on the main chuck, and returns the wafer to its original location in the wafer cassette. Thereafter, inspection of the subsequent wafers is repeated in the same manner as aforesaid. When inspection of all the wafers in the wafer cassette is finished, the operator replaces the wafer cassette with another one, and repeats the aforesaid inspection for new wafers.

However, development of larger wafers has recently been advanced, and 200-mm wafers are currently being replaced with 300-mm wafers. In semiconductor manufacturing processes including the aforementioned inspection process, the 200- and 300-mm wafers sometimes may be used mixedly. A conventional wafer cassette can only store wafers of one size, thus wafer cassettes of corresponding sizes are used for wafers of different sizes. Therefore, wafer cassettes of a plurality of types having different sizes are used mixedly in semiconductor manufacturing, and their handling is troublesome.

If the diameter of the wafers is 300 mm or more, moreover, it is not only hard but also dangerous for the operator to transport the wafer cassettes. Accordingly, the wafer transportation is expected to be automated by the use of automatic trucks or the like. In this case, the automatic trucks or other transportation apparatuses must handle wafer cassettes of different sizes and involve complicated control operations.

Since the conventional wafer cassettes are molded integrally, moreover, those wafer cassettes whose wafer support portions are damaged must be scrapped.

BRIEF SUMMARY OF THE INVENTION

The present invention has been made in order to solve at least one of the problems described above. According to one aspect of the invention, there is provided a wafer cassette of which an outer case can be repeatedly used by replacing damaged wafer support portions with new ones. According to another aspect of the invention, there is provided a wafer cassette in which wafers of different sizes can be stored in a cassette body of one type.

Additional objects and advantages of the invention will be set forth in the description which follows, and in part will be obvious from the description, or may be learned by practice of the invention. The objects and advantages of the invention may be realized and obtained by means of the instrumentalities and combinations described hereinafter.

According to an aspect of the invention, there is provided a wafer cassette for storing a plurality of wafer-shaped substrates, comprising: a case body having a gate through which the wafer-shaped substrates are loaded into or unloaded from the case body; at least one fitting portion located in the case body; and an adapter having a plurality of support portions individually supporting the wafer-shaped substrates and at least one fittable portion removably attached to the case body in the fitting portion of the case body.

Preferably, the adapter of the wafer cassette has any one of or any combination of the following configurations.

The adapter supports the wafer-shaped substrates, one at a time.

The adapter is of one of a plurality of types having the support portions different in construction, the construction of each type corresponding to the size of the substrates to be supported, and the case body can be loaded with adapters of at least two types out of three or more types.

The adapter supports a plurality of substrates of the same size.

The adapter supports a plurality of substrates of different sizes.

The support portions of the adapter support the respective end portions of the substrates of different sizes so that the end portions are situated in a predetermined position at the gate of the case body.

Each of the support portions of the adapter has a projection for preventing the supported substrates from springing out.

The fitting portion of the case body or the fittable portion of the adapter is a projection, and the other is a fitting hole in which the projection is fitted.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are views showing the adapter of the cassette shown in FIG. 1, in which FIG. 3A is a side view, and FIG. 3B is a sectional view;

FIGS. 6A and 6B are views illustrating the way a wafer is delivered between a prober and an RGV carrying a cassette thereon, in which FIG. 6A is a plan view, and FIG. 6B is a side view showing a principal part;

DETAILED DESCRIPTION OF THE INVENTION

One embodiment of the present invention will now be described with reference to FIGS. 1 to 8. A wafer cassette 10 according to the embodiment shown in FIG. 1 comprises a case body 11 having a gate 11A for wafers W and an adapter 12 removably set-in the case body 11. Although the adapter 12 should preferably be set into the case body 11 through the gate 11A, it may be set through any other portion such as the bottom or flank portion. In this case, the bottom or flank portion should be provided with an opening for adapter attachment. Each wafer-shaped substrate (hereinafter referred to as "wafer") W shown in FIG. 1 has a diameter of 200 mm.

Figure 1:
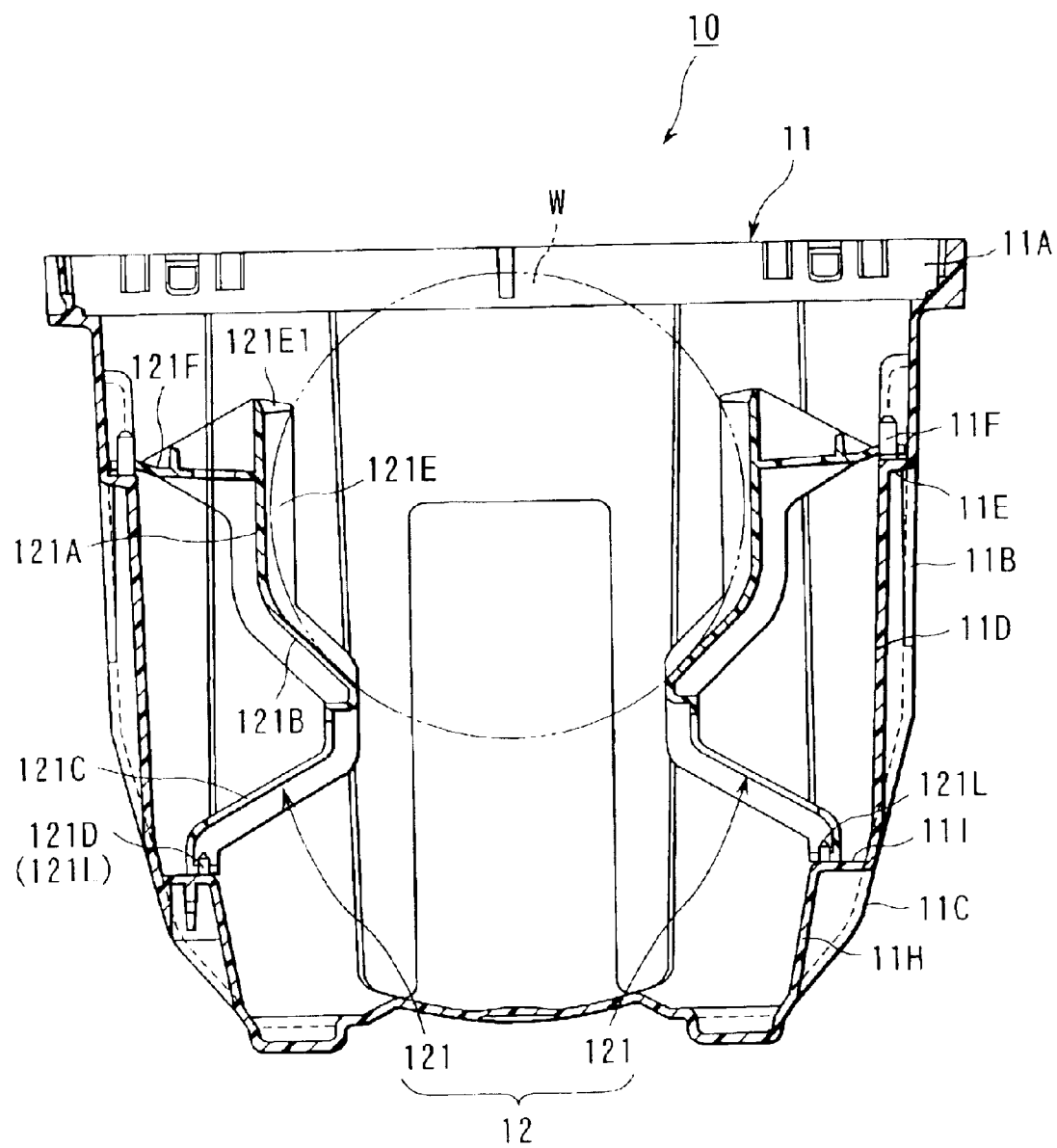
FIG. 1 is a sectional view showing an embodiment of a cassette of the present invention.
Figure 2A:
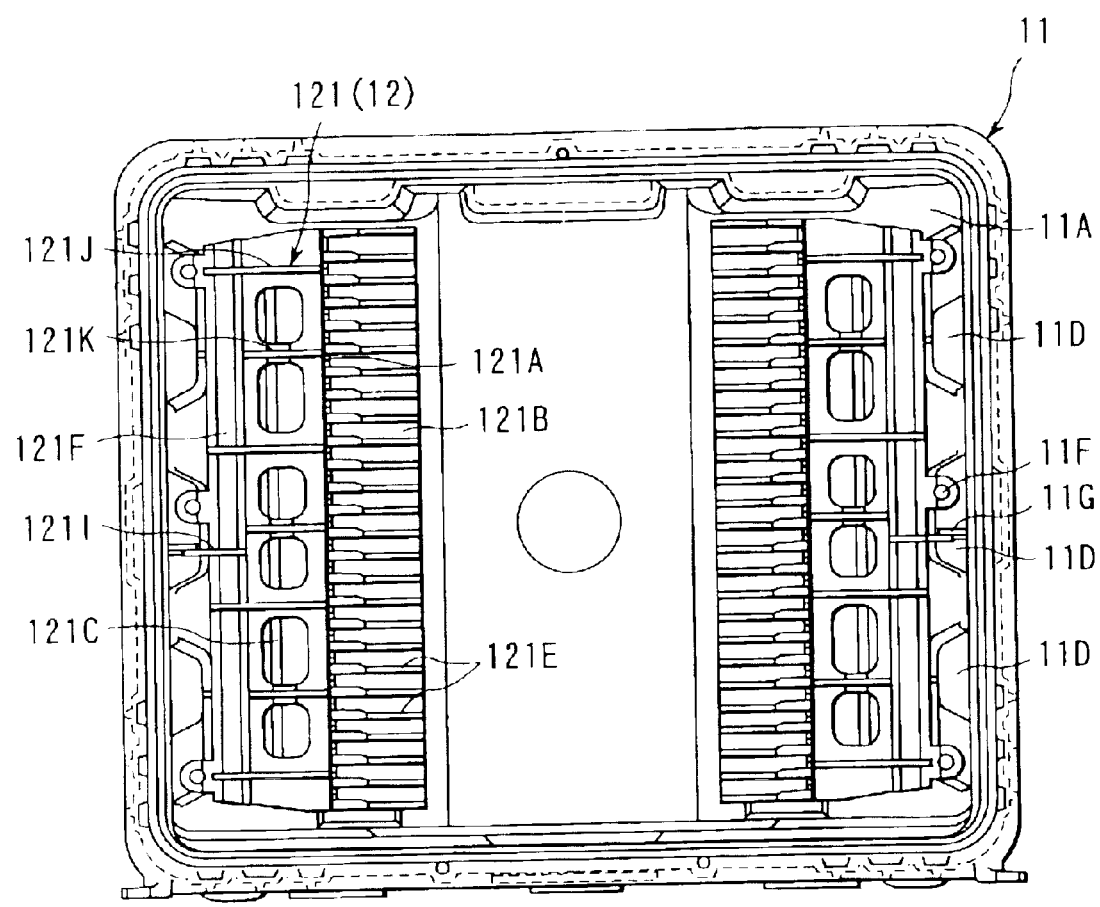
FIG. 2A is a front view of the cassette shown in FIG. 1 taken from its wafer gate.
Figure 2B:
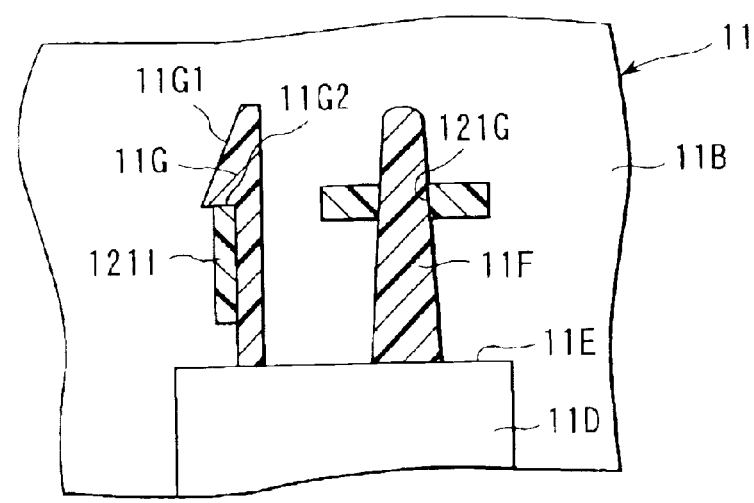
FIG. 2B is a sectional view showing the way an adapter is fitted in a case body.

As shown in FIGS. 1 and 2, the case body 11 may include a straight barrel portion 11B that extends under the gate 11A and a slanting portion 11C that declines form the barrel portion 11B. The gate 11A can be broader than the straight barrel portion 11B. Preferably, the gate 11A should be removably fitted with a lid (not shown). The side face of the straight barrel portion 11B may be formed having a first bulging portion 11D that bulges inward. The first bulging portion may be formed extending vertically with a given width. A plurality of (e.g., three) first bulging portions 11D may be arranged along the array of the wafers W (in the direction perpendicular to the drawing plane). Preferably, the upper surface of each first bulging portion 11D forms a horizontal portion 11E. The horizontal portion 11E should preferably be situated just above the middle of the straight barrel portion 11B. The horizontal portion 11E may have a fitting portion (e.g., projection) 11F that serves for positioning of the adapter 12 to be set in position. Preferably, the fitting projection 11F should be substantially conical in shape, as shown in FIG. 2B. As shown in FIG. 1, moreover, a similar fitting portion 121L may be formed on the lower part of the case body 11.

As shown in FIGS. 2A and 2B, moreover, the horizontal portion 11E of the central first bulging portion 11D may be formed having an anchor portion 11G for anchoring the adapter 12 in the case body 11. A slope $11G_1$ is formed on the distal end portion of the anchor portion 11G. A step portion $11G_2$ of the slope catches an engaging portion 121l of the adapter 12. The lower end of each first bulging portion 11D reaches the slanting portion 11C. The slanting portion 11C is formed having a vertical second bulging portion 11H that bulges inward from the lower end of the first bulging portion 11D. The second bulging portion 11H is formed along the array of the wafers W. The upper surface of the second bulging portion 11H is horizontal. A fitting portion (e.g., projection) 121L for fixing the adapter 12 is formed on a horizontal portion 11l of the second bulging portion 11H.

In the embodiment described above, the projections are formed on the fitting portions (11F and 121L) of the case body, and a fitting hole (121G) is formed in a fittable portion of the adapter. Alternatively, however, the fitting portion of the case body and the fittable portion of the adapter may be formed having a fitting hole and a fitting projection, respectively.

FIGS. 1 to 3 show the adapter 12 for substrates (wafers) with the diameter of 200 mm. The adapter 12 includes a pair of adapter elements 121, left and right. As shown in FIGS. 1 and 3, each adapter element 121 includes a vertical portion 121A, a slanting portion 121B, a reversely slanting portion 121C, and a fixing portion 121D. The slanting portion 121B declines from the lower end of the slanting portion 121A. The reversely slanting portion 121C inclines to the original position from the lower end of the slanting portion 121B. The fixing portion 121D projects horizontally from the lower end of the reversely slanting portion 121C toward the slanting portion 121B. The upper side of the slanting portion 121B is a side (inner surface) that supports the wafers W. As shown in FIGS. 1 and 3, the left- and right-hand slanting portions 121B form a constriction, which bears the wafers W.

As shown in FIGS. 1 to 3, fins having a substantially uniform width may be formed on the inner surface of each adapter element 121, in a region extending from the vertical portion 121A to the reversely slanting portion 121C. A range 121E of the fins from the vertical portion 121A to the slanting portion 121B forms a wafer support portion. As shown in FIG. 2A, a plurality of fins including the wafer support portion 121E are arranged at equal spaces in the wafer array direction of each adapter element 121. Preferably, the wafer support portion 121E should be formed having a projection $121E_1$ (FIG. 3A) that serves to prevent the wafers W from springing out of the case body 11. There are adapters of various types that have their support portions 121E varied in construction. The construction of each type corresponds to the size of the wafers to be supported.

As shown in FIGS. 1 to 3, a platelike overhang portion 121F is formed near the upper end of each adapter element 121 so as to stretch out close to the first bulging portion 11D of the case body 11. The overhang portion 121F is formed having three fitting holes 121G in which fitting projections 11F of the case body 11 can be fitted. As shown in FIG. 2B, a slope for engagement with the conical fitting projection 11F is formed on the inner surface of each fitting hole 121G. As shown in FIG. 3B, moreover, a fitting hole 121H is formed in the lower end portion of the outer surface of the adapter element 121. The fitting projection 121L (FIG. 1) on the case body 11 can be fitted in this fitting hole.

As shown in FIGS. 2A and 2B, a platelike engaging portion 121I is formed near the central fitting hole 121G so as to extend vertically upward from the overhang portion 121F. The engaging portion 121I projects outward from the overhang portion 121F. The projecting engaging portion 121I can engage the anchor portion 11G of the case body 11. The overhang portion 121F has two types of reinforcement portions 121J and 121K that are spaced in the direction of the line of wafers W.

In setting the adapter 12 in the case body 11, the adapter elements 121 are attached individually to the opposite sides of the case body 11. The one adapter element 121 is inserted into the case body 11 through the gate 11A with its fixing portion 121D downward, and the fitting holes 121G of the adapter element 121 are aligned individually with the fitting projections 11F of the case body 11. As the adapter element 121 is pushed into the case body 11, the fitting projections 11F are fitted individually into the fitting holes 121G. Thereupon, the adapter element 121 is guided by the fitting projections 11F as it enters into the case body 11. As this is done, the engaging portion 121I lowers along the slope $11G_1$ of the anchor portion 11G in a manner such that it is elastically in contact with the anchor portion 11G. When the fitting projections 11F are fitted individually in the fitting holes 121G and as the engaging portion 121I engages the anchor portion 11G, as shown in FIG. 2B, the adapter element 121 is bound and fixed in the case body 11. Then, the other adapter element 121 is set in the case body 11 in a like manner. The adapter 12 is joined together with the case body 11 as the fixing portion 121D of the adapter element 121 is fitted in the engaging portion 121I of the horizontal portion 111 of the case body 11.

Figure 4:
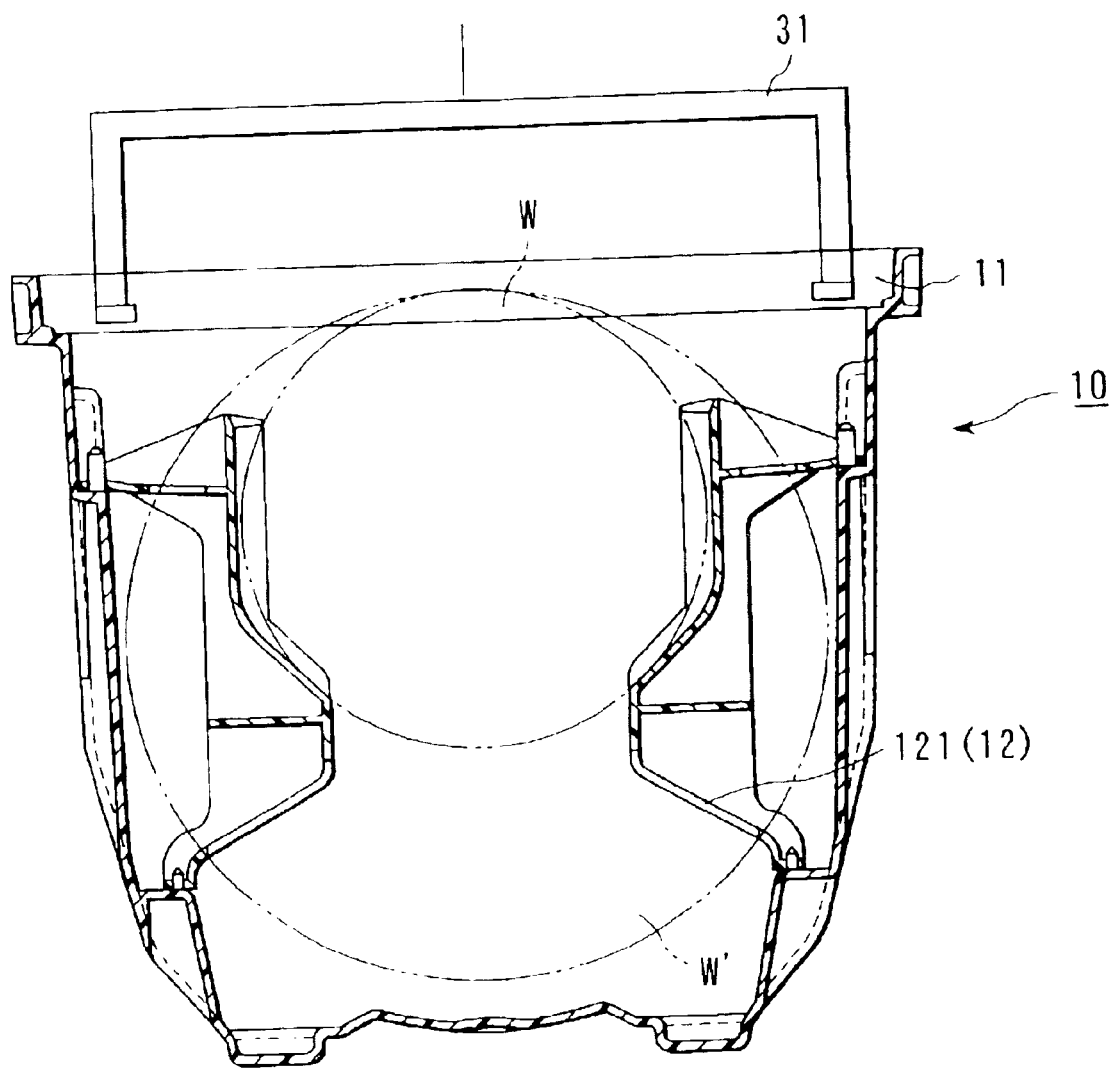
FIG. 4 is a sectional view for illustrating the way wafers of different sizes are stored in place.
Figure 7:
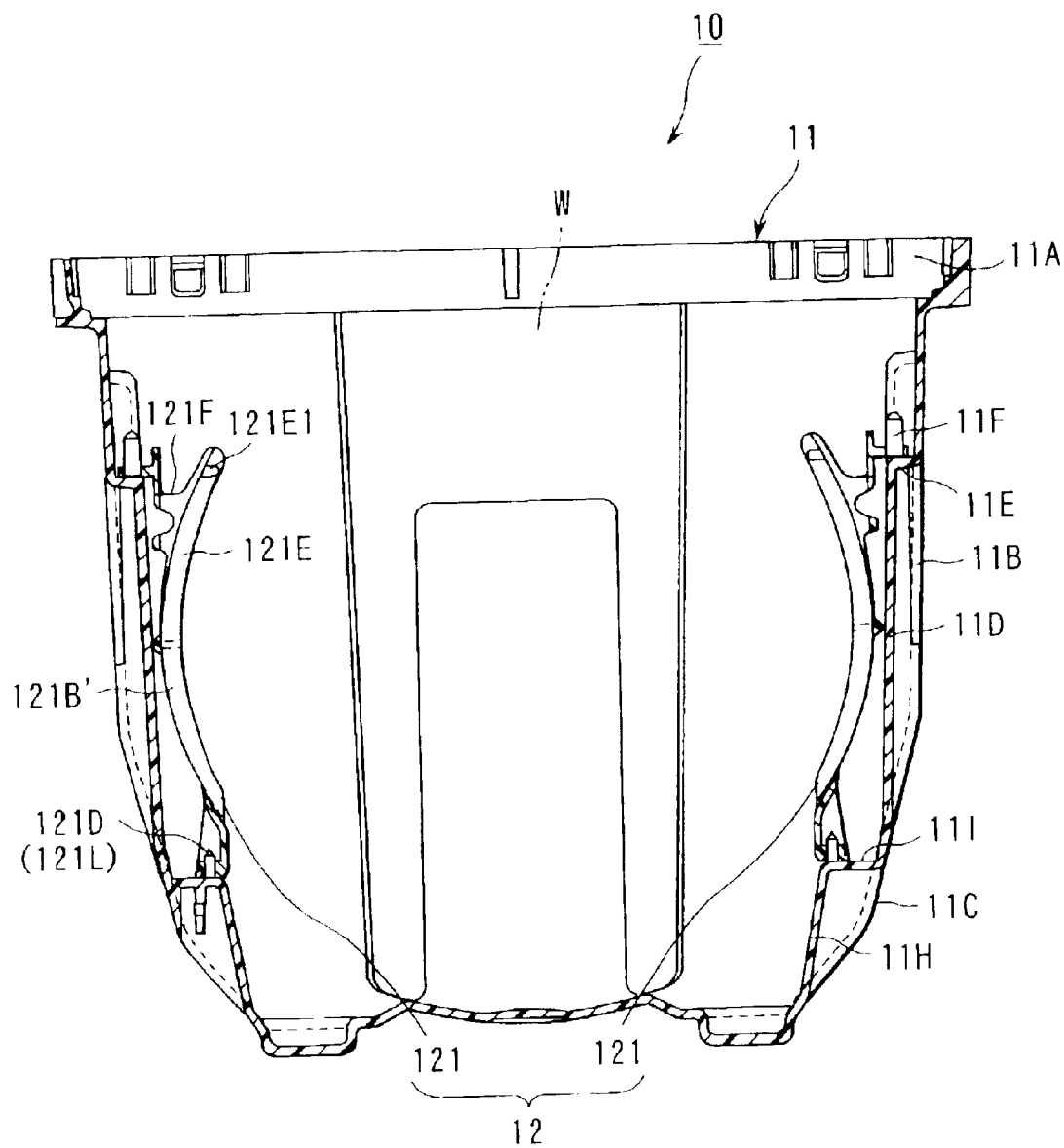
FIG. 7 is a sectional view showing another embodiment of the cassette of the invention capable of storing wafers larger than the ones stored in the cassette of FIG. 1.
Figure 8:
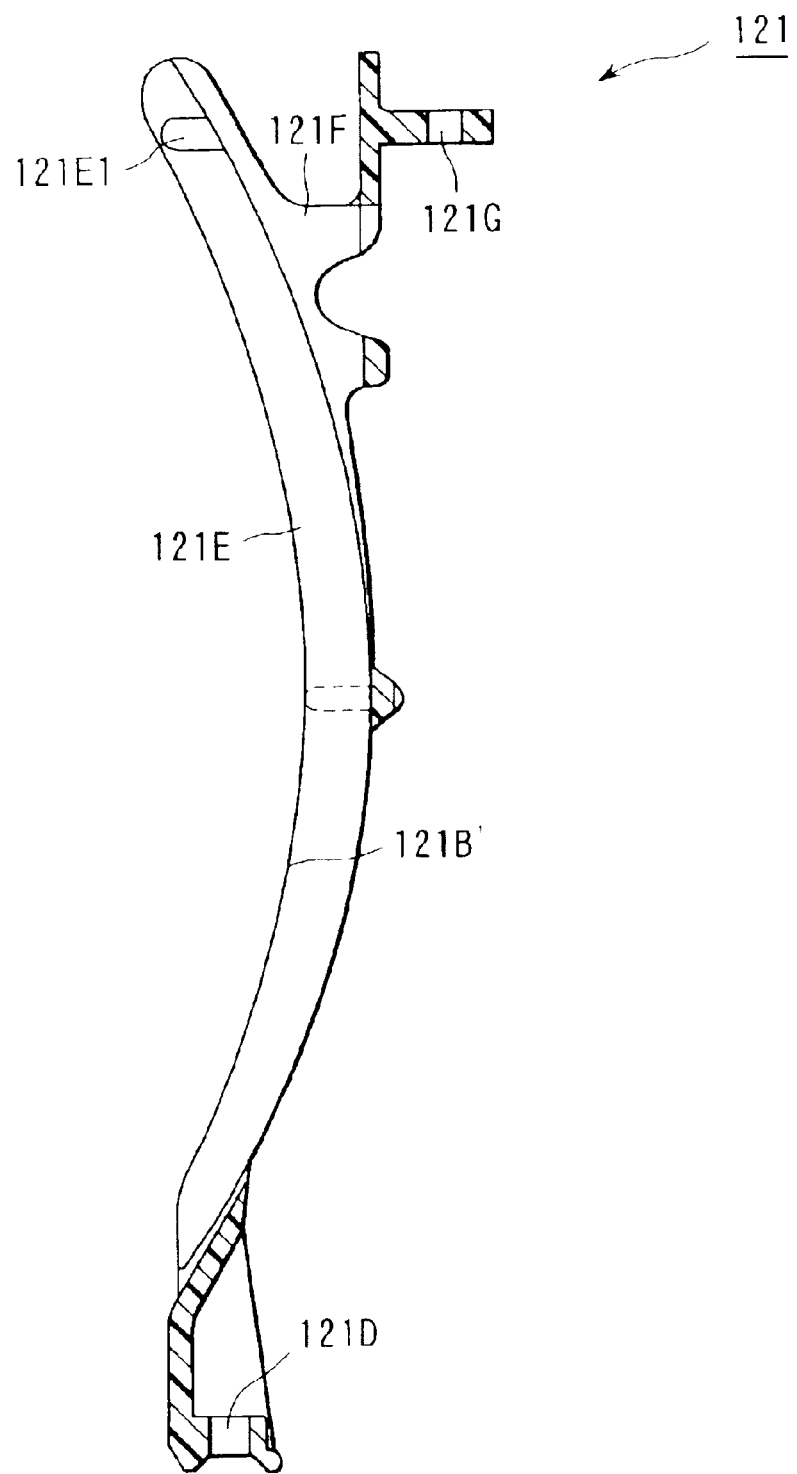
FIG. 8 is a side view of an adapter for the cassette shown in FIG. 7.

An example of the adapter 12 for 200-mm wafers has been described above with reference to FIGS. 1 to 3. The case body 11 shown in FIG. 1 can also be adapted for 300-mm wafers. An example of the adapter for 300-mm wafers is shown in FIG. 8. FIG. 7 shows the adapter set in the case body 11. The adapter for 300-mm wafers can be formed of a substantially arcuate portion 121B' without involving any constriction (slanting portion 121B and reversely slanting portion 121C) for 200-mm wafers. In other respects, this adapter is constructed in substantially the same manner as the adapter for 200-mm wafers. As shown in FIGS. 4 and 7, the case body 11 that is loaded with the adapter for 300-mm wafers can be used as the wafer cassette 10 for 300-mm wafers. In FIG. 4, W and W' designate a 200-mm wafer and a 300-mm wafer, respectively.

A wafer holder (not shown) in which a 200-mm wafer adapter and a 300-mm wafer adapter, half filled with their corresponding wafers each, are set together in the same case body 11 can hold the 200- and 300-mm wafers together. On the other hand, the same adapter may be provided with a wafer support portion for 200-mm wafers and a wafer support portion for 300-mm wafers. A wafer holder in which this adapters are set in the one case body 11 can also store 200- and 300-mm wafers together. Preferably, the respective top ends of wafers of different sizes (e.g., 200- and 300-mm wafers) that are supported by means of the adapter 12 should be situated in the same position at the gate of the case body 11, as shown in FIG. 4. Since all the wafers are situated in the same position, the same mapping sensor 31 at the gate of the case body 11 can securely detect the presence, number, and thickness of the wafers W.

Figure 5:
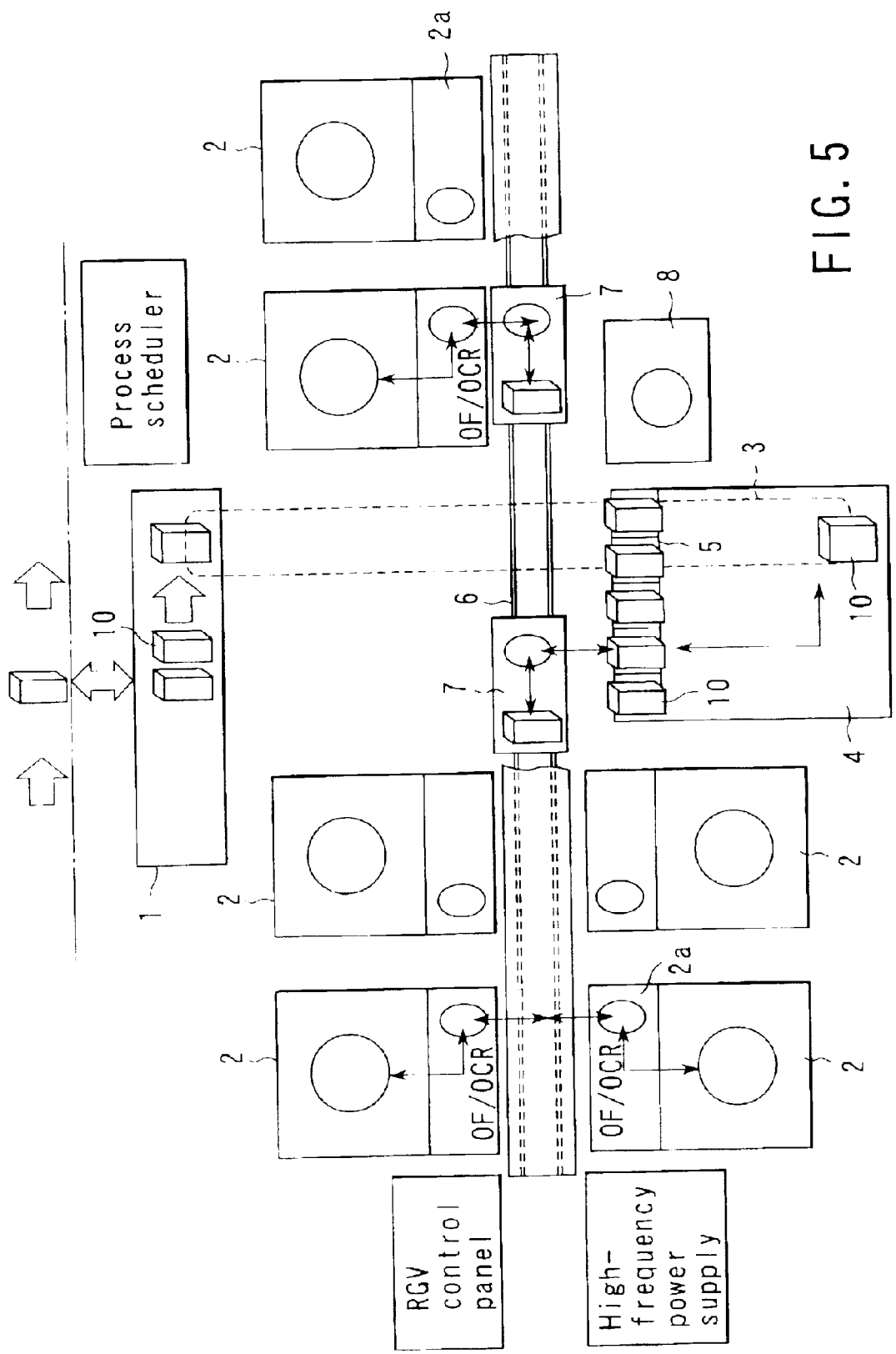
FIG. 5 is a diagram for illustrating the path of transfer of wafers in an inspection process.

Processes in which the wafer cassette 10 of the present embodiment is used for inspection will now be described with reference to FIGS. 5 and 6. As shown in FIG. 5, wafers are automatically transported between a main stocker 1 and probers 2 by means of wafer cassettes 10. The probers 2 of the present embodiment are designed for use in single wafer processing systems in which wafers are received and processed one by one, not units of cassettes, as mentioned later. However, the system of wafer cassette utilization is not limited to the single wafer processing system.

The main stocker 1 is coupled to a mini-stocker 4 by means of a raceway 3 that is arranged on the ceiling. The wafer cassettes 10 can move along the raceway 3 from the main stocker 1 to the mini-stocker 4. The main stocker 1 can store a plenty of (e.g., about 200) wafer cassettes 10. The mini-stocker 4 stores a few (e.g., about 20) wafer cassettes 10 that are received from the main stocker 1 according to the work amount of inspection by means of the probers 2. A buffer table 5 is located at each end of the mini-stocker 4. The wafer cassettes 10 are placed on the buffer tables 5. The buffer tables 5 and the probers 2 can be coupled by means of rails 6. Automatic transport vehicle (RGVs) 7 that travel on the rails 6 transport the wafers. The RGVs 7 deliver the wafers W one after another between the buffer tables 5 and the probers 2. A card stocker 8 that stores a plurality of probe cards may be located adjacent to the mini-stocker 4.

A plurality of probers 2 and RGVs 7 as many as the probers 2 are arranged in a semiconductor manufacturing plant. In some cases, the inspection may cover a plurality of items.

Figure 6A:
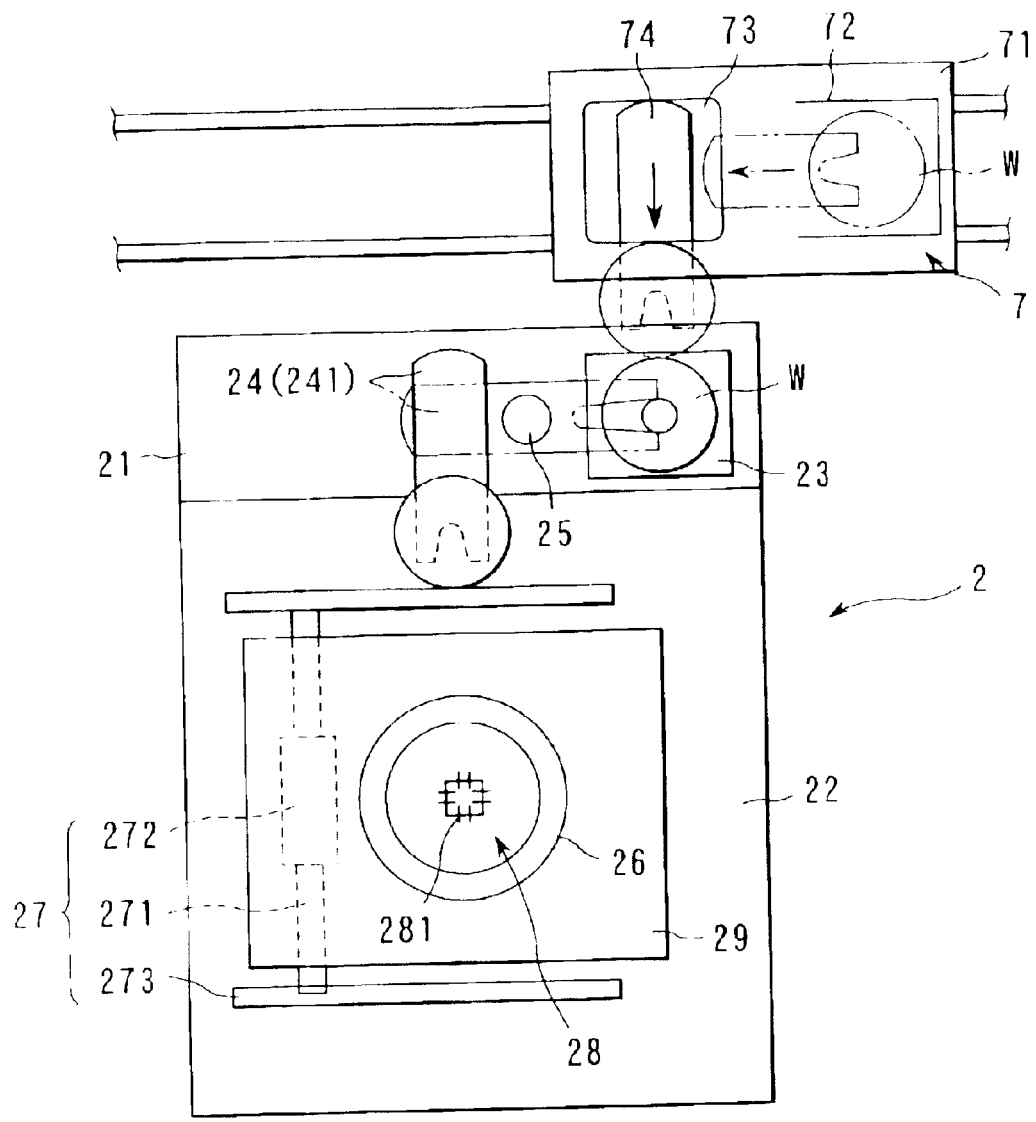
Figure 6B:
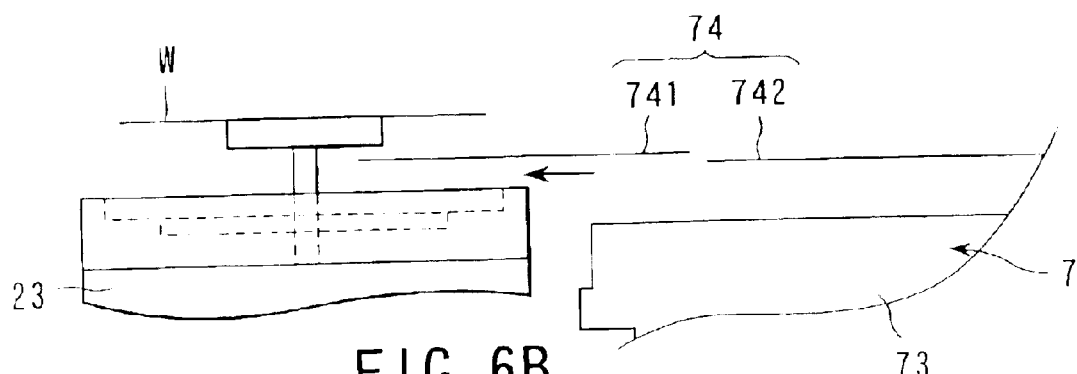

As shown in FIGS. 6A and 6B, each prober 2 is provided with a loader chamber 21 and a prober chamber 22. The loader chamber 21 may include a delivery mechanism 23, a wafer conveyor mechanism 24, and an aligning mechanism (hereinafter referred to as "sub-chuck") 25. The delivery mechanism 23 delivers the wafers W one after another to and from the RGV 7. The wafer conveyor mechanism 24 transports the wafers W between the delivery mechanism 23 and the prober chamber 22. The sub-chuck 25 pre-aligns the wafers W as the wafer conveyor mechanism 24 transports the wafers to the prober chamber 22. As the sub-chuck 25 rotates each wafer W to align it, an orientation flat sensor (not shown) detects the orientation flat of the wafer, and an optical character reader (OCR, not shown) reads an ID code on the wafer W to identify the wafer W as an object of inspection. The wafer conveyor mechanism 24 has upper and lower hands 241. Each hand 241 can hold the wafer W by vacuum suction. If the vacuum suction is turned off, the wafer W is allowed to be delivered.

The prober chamber 22 includes a main chuck 26 (mentioned later), an alignment mechanism 27, and a probe card 28. The main chuck 26, along with an XY-table 29, moves in the X- and Y-directions. The main chuck 26 is moved in the Z- and θ-directions by means of a lift mechanism and a θ-rotation mechanism (not shown). The alignment mechanism 27, like a conventional one, includes an alignment bridge 271, a CCD camera 272, and a pair of guide rails 273. The alignment mechanism 27 aligns the wafer W and the probe card 28 in cooperation with the main chuck 26. The probe card 28 includes a plurality of probes 281. The probes 281 are connected electrically to the electrodes of the wafer W on the main chuck 26, whereby a test head (not shown) and a tester 7 (see FIG. 1) are connected to each other.

As shown in FIGS. 6A and 6B, for example, each RGV 7 is provided with an RGV body 71, a buffer cassette 72, a turning mechanism 73 adjacent to the buffer cassette 72, a wafer conveyor mechanism 74, the mapping sensor 31 (FIG. 4) for wafers, and an ejection preventing member (not shown). The buffer cassette 72 is located on an end portion of the RGV body 71, and can drive 25 wafers W in an inclined position. The wafer conveyor mechanism 74 has upper and lower retractable arms that are attached to the turning mechanism 73. The mapping sensor 31 is attached to the wafer conveyor mechanism 74. The ejection preventing member can prevent the wafers W from springing out of the buffer cassette 72. The buffer cassette 72 can be constructed in accordance with the construction of the wafer cassette 10. The cassette 72 is provided with a case and an adapter that correspond to 200- and 300-mm wafers. The wafer conveyor mechanism 74 has hands 741 and 742 that are attached to the respective distal ends of the upper and lower arms. The wafer conveyor mechanism 74 can be raised and lowered together with the turning mechanism 73 by means of a ball screw mechanism, for example. The ejection preventing member includes stopper rods and a drive mechanism. The stopper rods can individually engage grooves that are formed in the respective centers of upper and lower frames on the front face of the buffer cassette 72. The drive mechanism causes the stopper rods to engage the grooves, individually.

As the wafers W are delivered between the wafer cassette 10 on the buffer table 5 and the buffer cassette 72 of each RGV 7, the wafer conveyor mechanism 74 repeats turning, ascent, and descent. Thereupon, the wafers W (e.g., 25 wafers) are transported between the wafer cassette 10 and the buffer cassette 72 by means of, for example, the upper hand 741. The RGV 7 moves along the rails 6 to the target prober 2 with the wafers W prevented from springing out, whereupon the wafers W are delivered between the RGV 7 and the prober 2. As this is done, the wafers W are delivered from the RGV 7 to the prober 2 by means of the upper hand 741 of the wafer conveyor mechanism 74, while the examined wafers W are received from the prober 2 by means of the lower hand 742.

The RGV 7 receives, for example, 25 wafers W from the buffer table 5 delivered by means of the wafer conveyor mechanism 74. After the wafers W in the wafer cassette 10 on the buffer table 5 are mapped by means of the mapping sensor 31, as this is done, the wafer conveyor mechanism 74 transfers these wafers W to the buffer cassette 72 in the RGV 7. The RGV 7 moves along the rails 6 to the specified prober 2. After the wafers W in the buffer cassette 72 are mapped, specified wafers W are delivered to the delivery mechanism 23 of the prober 2. The prober 2 examines the wafers received from the delivery mechanism 23 one after another. The examined wafers are returned to the RGV 7.

In some cases, the adapter 12 may be worn or damaged as the wafer cassette 10 is used. In this case, the case body 11 can be repeatedly used provided the adapter 12 according to the present embodiment is replaced with a new one. The wafer cassette 10 having the adapter 12 for 200-mm wafers set in the case body 11 and the wafer cassette 10 having the adapter for 300-mm wafers can be used to cope with the application of a case that holds the 200- and 300-mm wafers together. In this case, the size of the case body 11 itself is fixed, so that a transport vehicle or RGV 7 can equally handle the wafer cassettes of the two sizes. Thus, the handling can be made much more convenient.

According to the present embodiment, as described above, the case body 11 and the adapter 12 are united in a manner such that the fitting projections 11F of the case body 11 are fitted individually in the fitting holes 121G of the adapter 12. If the wafer support portions 121E are damaged, the case body 11 can be repeatedly used with the adapter 12 replaced with new ones, thus ensuring good economical efficiency.

In setting the adapter 12 in the case body, the fitting holes 121G of the adapter 12 can be aligned with the fitting projections 11F of the case body 11 as the adapters 12 is pushed into the case body 11. Thus, the engaging portion 121I and the anchor portion 11G can be caused automatically to engage each other to bind the adapter 12 in the case body 11. The adapter 12 can be very easily set in the case body 11 and also replaced with new ones.

In the present embodiment, the case body 11 can be fitted with adapters for 200- and 300-mm wafers. If 200- and 300-mm wafers are mixed in semiconductor manufacturing processes such as an inspection process, the wafers of different sizes can be handled without specially modifying the RGVs 7 or other automatic transport Vehicle. This is because the wafer cassettes 10 containing the wafers of different sizes have the same external dimensions.

According to the present embodiment, the adapters for 200- and 300-mm wafers, for example, can be set together in the case body 11, so that one wafer cassette can simultaneously transport 200- and 300-mm wafers. This is an effective function for the case where the prober 2 concurrently examines these two types of wafer.

According to the present embodiment, an end portion of a wafer W that is supported by means of an adapter for 200-mm wafers and an end portion of a wafer W' that is supported by means of an adapter for 300-mm wafers are situated in the same position at the gate portion. Thus, the wafers in the wafer cassette 10 can be securely mapped by means of the mapping sensor 31 without regard to the wafer size. In consequence, the wafers can be transferred smoothly. Since the adapter 12 is formed of the left- and right-hand adapter elements 121 and 121, it can be molded with ease, and a plurality of adapters can be stored without becoming bulky.

The present invention is not limited to the embodiment described above, and various changes and modifications may be made as required.

According to the present embodiment, the case body can store the adapters for 200- and 300-mm type wafers. Alternatively, however, adapters of three or more types may be stored in the case body.

According to the present embodiment, the outside case body can be repeatedly used with only damaged adapters replaced with new ones, so that an economical wafer cassette can be provided.

According to the present embodiment, wafers of different sizes can be stored in a wafer cassette of one external size.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A wafer cassette for storing a plurality of wafer-shaped substrates, comprising:

a case body, the case body having a gate through which the wafer-shaped substrates are loaded into or unloaded from the case body;

at least one fitting portion located in the case body; and an adapter comprising a plurality of support portions individually supporting the wafer-shaped substrates so that the end portions of wafer-shaped substrates of different sizes are situated in the same predetermined position at the gate of the case body, and at least one fittable portion removably attached to the case body in the at least one fitting portion.

2. A wafer cassette according to claim 1, wherein the adapter includes a pair of adapter elements, each of the adapter elements having a plurality of support portions individually supporting the wafer-shaped substrates.

3. A wafer cassette according to claim 1, wherein the adapter supports the wafer-shaped substrates, one at a time.

4. A wafer cassette according to claim 3, wherein the at least one fitting portion or the fittable portion of the adapter is a projection, and the other is a fitting hole in which the projection is fitted.

5. A wafer cassette according to claim 1, wherein the adapter is of one of a plurality of types having the support portions different in construction, the construction of each type corresponding to the size of the wafer-shaped substrates to be supported, and the case body can be loaded with adapters of at least two types.

6. A wafer cassette according to claim 5, wherein the adapter supports a plurality of wafer-shaped substrates of the same size.

7. A wafer cassette according to claim 5, wherein the adapter supports a plurality of wafer-shaped substrates of different sizes.

8. A wafer cassette according to claim 5, wherein each said support portion of the adapter has a projection for preventing the supported wafer-shaped substrates from springing out.

* * * * *